United States Patent
Kirihara et al.

(10) Patent No.: US 12,041,853 B2
(45) Date of Patent: Jul. 16, 2024

(54) PORTABLE POWER SUPPLY

(71) Applicant: NEC Corporation, Tokyo (JP)

(72) Inventors: Akihiro Kirihara, Tokyo (JP); Masahiko Ishida, Tokyo (JP); Koichi Terashima, Tokyo (JP); Yuma Iwasaki, Tokyo (JP); Ryohto Sawada, Tokyo (JP); Yasutomo Omori, Tokyo (JP)

(73) Assignee: NEC CORPORATION, Tokyo (JP)

( * ) Notice: Subject to any disclaimer, the term of this patent is extended or adjusted under 35 U.S.C. 154(b) by 478 days.

(21) Appl. No.: 17/296,392

(22) PCT Filed: Nov. 14, 2019

(86) PCT No.: PCT/JP2019/044760
§ 371 (c)(1),
(2) Date: May 24, 2021

(87) PCT Pub. No.: WO2020/116122
PCT Pub. Date: Jun. 11, 2020

(65) Prior Publication Data
US 2022/0037576 A1    Feb. 3, 2022

(30) Foreign Application Priority Data
Dec. 4, 2018  (JP) .................................. 2018-227024

(51) Int. Cl.
*H10N 15/10*   (2023.01)
*F24C 3/14*    (2021.01)

(52) U.S. Cl.
CPC ............... *H10N 15/10* (2023.02); *F24C 3/14* (2013.01)

(58) Field of Classification Search
CPC .......... H10N 15/10; H10N 15/00; F24C 3/14; H01L 29/82; H02N 11/00
See application file for complete search history.

(56) References Cited

U.S. PATENT DOCUMENTS 5,563,368 A * 10/1996 Yamaguchi ............ H10N 15/00
                                                  136/211
6,051,821 A *  4/2000 Dahl ....................... H05B 3/74
                                                  219/622
(Continued)

FOREIGN PATENT DOCUMENTS

GB      2531608 A  *  4/2016 ............. F23D 14/28
JP   H02-247997 A     10/1990
(Continued)

OTHER PUBLICATIONS

T.C. Chuang et al., Enhancement of the anomalous Nernst effect in ferromagnetic thin films, Nov. 7, 2017, Physical Review B 96 (17) (Year: 2017).*

(Continued)

*Primary Examiner* — Tulsidas C Patel
*Assistant Examiner* — Joshua Kiel M Rodriguez
(74) *Attorney, Agent, or Firm* — Sughrue Mion, PLLC

(57) ABSTRACT

A portable power supply according to one or more embodiments includes a combustion device (20) and a heating container (30) that retains an object to be heated, wherein at least a part of a portion of the heating container, the portion being directly heated by the combustion device, is provided with a magnetic metal plate (32) that has spontaneous magnetization and that generates electromotive force due to an anomalous Nernst effect induced by the heating, and wherein electrodes (33a, 33b) for drawing power are provided. Thus, the heating container for generating electricity has a simple configuration, and furthermore the portable power supply is provided with both the heating container and the combustion device.

13 Claims, 12 Drawing Sheets

(56) References Cited

U.S. PATENT DOCUMENTS

| | | | |
|---|---|---|---|
| 2003/0084669 A1 | 5/2003 | Luo | |
| 2006/0016446 A1* | 1/2006 | Hu | F24C 3/027 126/41 R |
| 2011/0041887 A1 | 2/2011 | Takahashi | |
| 2015/0201805 A1* | 7/2015 | Cedar | A47J 37/0786 320/101 |
| 2016/0072038 A1* | 3/2016 | Yuasa | H10N 15/00 136/205 |

FOREIGN PATENT DOCUMENTS

| | | | |
|---|---|---|---|
| JP | H05-199942 A * | 8/1993 | |
| JP | 2003-161566 A | 6/2003 | |
| JP | 4247460 B | 4/2009 | |
| JP | 2011-177019 A | 9/2011 | |
| JP | 2013-042862 A | 3/2013 | |
| JP | 2017084854 A * | 5/2017 | |
| JP | 2018-046594 A | 3/2018 | |
| JP | 2018-078147 A | 5/2018 | |
| KR | 10-20080096137 A * | 10/2008 | |
| WO | 2009139295 A1 | 11/2009 | |
| WO | 2013027749 A1 | 2/2013 | |
| WO | WO-2016190001 A1 * | 12/2016 | H01L 35/08 |

OTHER PUBLICATIONS

English translation of JP-2018078147A (Year: 2018).*
English translation of JP-H05-199941A (Year: 1993).*
International Search Report of PCT Application No. PCT/JP2019/044760 mailed Jan. 28, 2020.
English translation of Written opinion for PCT Application No. PCT/JP2019/044760, mailed on Jan. 28, 2020.

* cited by examiner

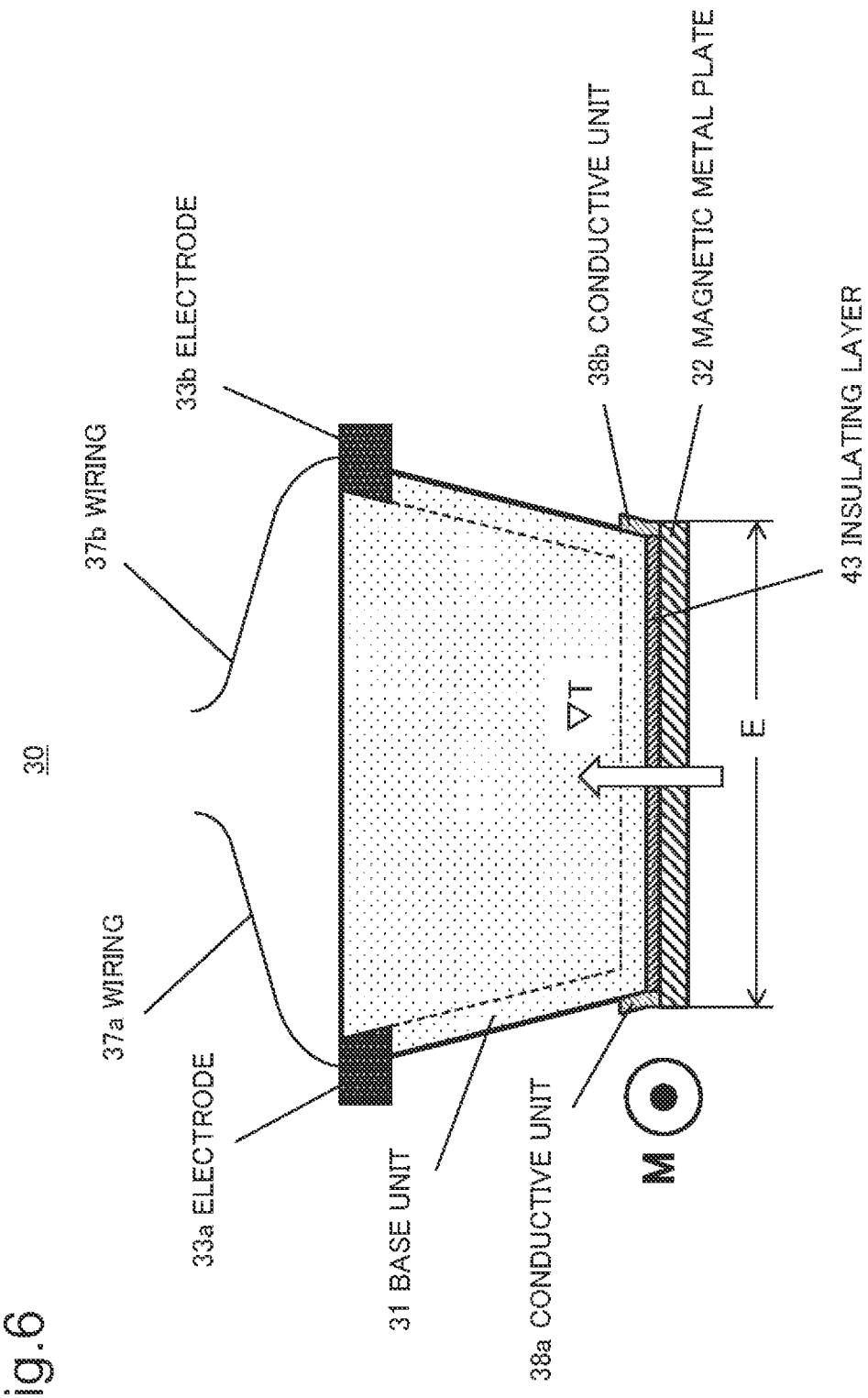

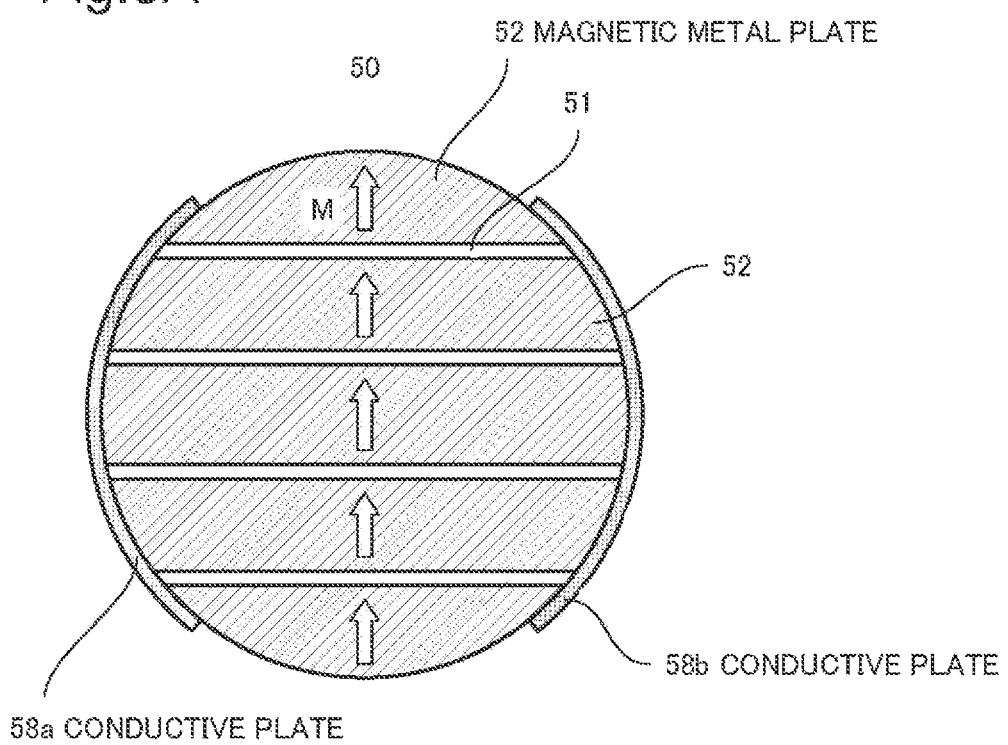

PORTABLE POWER SUPPLY

This application is a National Stage Entry of PCT/JP2019/044760 filed on Nov. 14, 2019, which claims priority from Japanese Patent Application 2018-227024 filed on Dec. 4, 2018, the contents of all of which are incorporated herein by reference, in their entirety.

TECHNICAL FIELD

The present invention relates to a portable power supply.

BACKGROUND ART

There is a strong need for a carriable and portable power supply in a place where electrical infrastructure is underdeveloped, such as a campsite and a developing country, and in a disaster, a military situation, or the like. A portable generator based on a steam turbine and the like has been known for a long time, but such a generator has a major problem, particularly in a military application, that the generator produces a loud sound during power generation and is difficult to miniaturize.

An alternative technique is to use a thermoelectric conversion element. PTL 1 discloses a cooking appliance (pan) having a thermoelectric power generation function based on a Seebeck effect (FIG. 1 of the same document). A thermoelectric conversion module is attached to a bottom of a main body of the cooking appliance. Generation of about 30 W is demonstrated by utilizing a large temperature difference between a high-temperature portion (up to 500° C.) on a bottom surface, which is heated, and a low-temperature portion (up to 100° C.) on an inside of a container, which contains boiling water or the like. As the thermoelectric conversion module, for example, a p-type thermoelectric conversion element and an n-type thermoelectric conversion element are connected in series on a substrate as illustrated in FIG. 3.

PTL 2 describes a power generation apparatus for a system kitchen using exhaust heat of a gas burner. A high-temperature side of a thermoelectric power generation module for generating power by a Seebeck effect is disposed in such a way as to be in direct or indirect contact with gas flame, and a water-cooled piping is provided on a low-temperature side. The thermoelectric power generation module uses a p-type semiconductor and an n-type semiconductor which are connected via a low-temperature side metal electrode and a high-temperature side metal electrode.

PTL 3 is a cooling structure of a portable thermoelectric generator, in which a power generation unit is sandwiched between a heat input unit and a heat dissipation unit. In the heat input unit, the power generation unit is heated by combusting a fuel such as butane. A thermoelectric element constituting the power generation unit is configured by a p-type thermoelectric element and an n-type thermoelectric element of Bi—Te, Fe—Si2, or Pb—Sn—Te type. A large number of such thermoelectric elements are provided, and electric power is generated by heat from a heat input unit. The heat radiation unit has a flow path of a cooling liquid and a flow path of a gas in which the cooling liquid is vaporized, and the cooling liquid flowing through the flow path of the cooling liquid is vaporized by receiving heat transmitted from the power generation unit, and a low temperature side of the power generation unit is cooled by vaporization heat of the colling liquid. The gas is discharged to an outside through the flow path of the gas. In this way, the thermoelectric generator can be reduced in size, thickness, and weight.

PTL 4 describes a portable power generation apparatus. A vortex combustor is provided on a high temperature side of a thermoelectric power generation module, a cooling unit is provided on a low temperature side of the thermoelectric power generation module, and a control unit for controlling power generation and a battery unit are provided. Further, a fuel supply unit for supplying fuel gas to the vortex combustor and a combustion air supply unit for supplying combustion air to the vortex combustor are provided. The battery unit supplies electric power to the combustion air supply unit and an ignition device until the thermoelectric power generation module starts generating electric power. The thermoelectric power generation module uses a Seebeck element, and is formed by attaching an n-type semiconductor and a p-type semiconductor to each other. In this way, a portable power generation apparatus which is compact and has excellent power generation efficiency can be provided.

CITATION LIST

Patent Literature

PTL 1 International Patent Publication No. WO 2013/027749
PTL 2 Japanese Patent No. 4247460
PTL 3 Japanese Unexamined Patent Application Publication No. 2011-177019
PTL 4 Japanese Unexamined Patent Application Publication No. 2018-046594

SUMMARY OF INVENTION

Technical Problem

All of the thermoelectric conversion elements in PTLs 1 to 4 are required to form an element structure and are costly. Furthermore, in PTL 1, a heat source such as a stove for heating the cooking appliance is separately needed. When a heating container is attached to the power generating apparatus in PTLs 2 to 4, it is necessary to attach a heating container separately from the power generating apparatus.

An object of the present invention is to solve the above-mentioned problems and to provide a portable power supply having a simple structure of a heating container for generating electric power and including both the heating container and a combustion device.

Solution to Problem

The present invention is a portable power supply including: a combustion device; and a heating container for holding a heating target. The heating container includes, in at least a part of a portion that is directly heated by the combustion device, a magnetic metal plate having spontaneous magnetization and generating electromotive force by producing an anomalous Nemst effect by being heated, and an electrode for extracting electric power.

Advantageous Effects of Invention

According to the present invention, since only a part of a metal constituting the heating container needs to be made of a magnetic metal plate, a structure of the heating container can be made extremely simple and low in cost, and both the heating container and the combustion device are provided and are not necessary to be separately installed.

BRIEF DESCRIPTION OF DRAWINGS

FIG. 6 is a cross-sectional diagram illustrating a cooking vessel used in a portable power supply according to a fourth example embodiment of the present invention.

FIG. 8A is a diagram illustrating a back surface of the cooking vessel according to the fourth example embodiment of the present invention.

EXAMPLE EMBODIMENT

First Example Embodiment

A first example embodiment of the present invention is described with reference to FIGS. 1 to 3.

Figure 1:
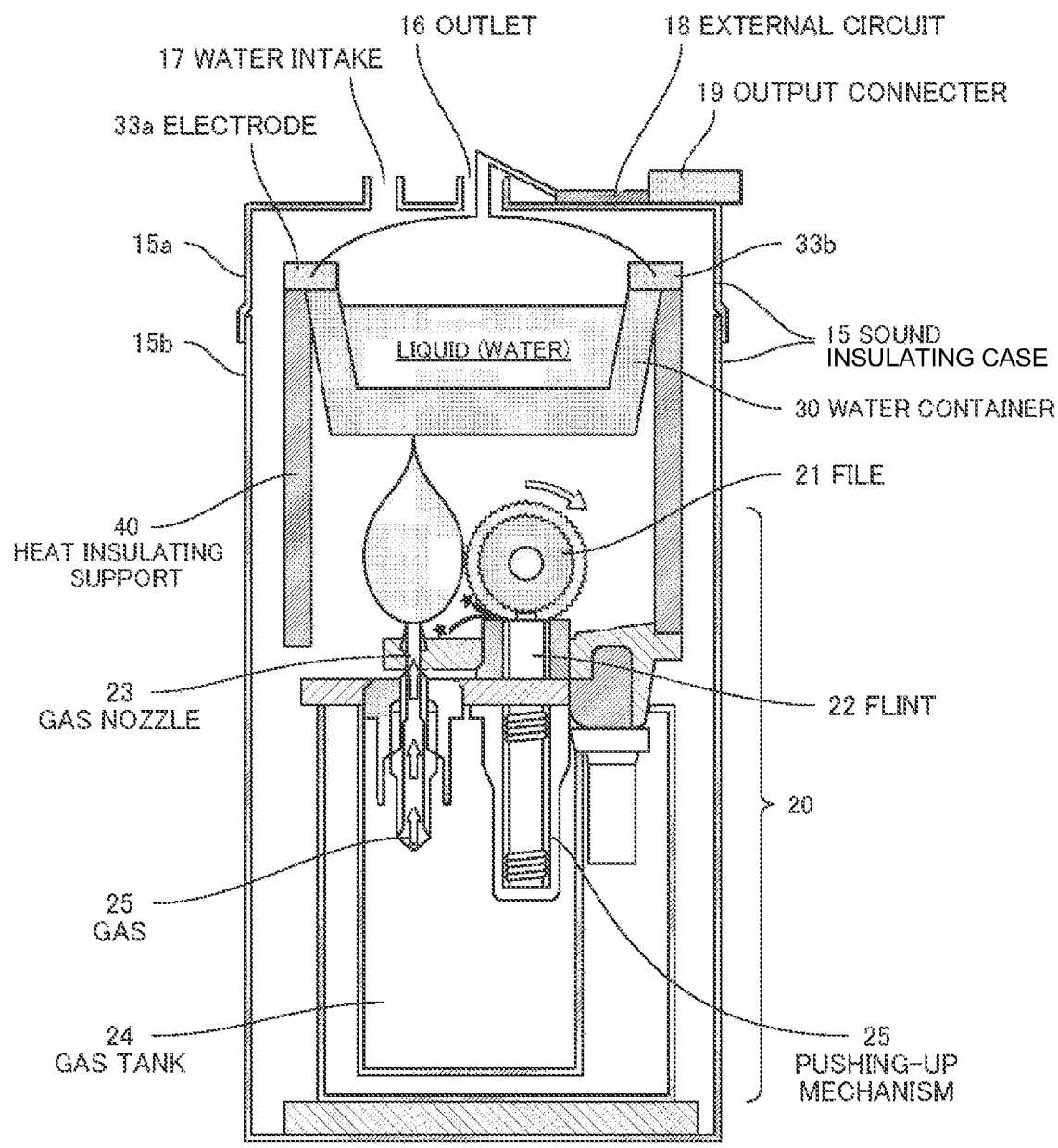
FIG. 1 is a schematic cross-sectional diagram of a portable power supply according to a first example embodiment of the present invention.

FIG. 1 is a schematic cross-sectional diagram of a portable power supply 10 according to the first example embodiment. An exterior of the portable power supply 10 is a sound insulating case 15, and an interior is roughly divided into a combustion device 20 for starting fire, a water container 30 for holding water and generating electricity from a temperature difference, and a heat insulating support 40. The water container 30 corresponds to a heating container.

The combustion device 20 includes a fuel tank, a nozzle for discharging fuel from the fuel tank, and an ignition unit in the vicinity of the nozzle. An ignition method is a flint method being used in a lighter or the like used when lighting a cigarette.

The combustion device 20 includes a file 21, a flint 22, a gas tank 24, and a gas nozzle 23. An aperture is made in the sound insulating case 15 at a position of the file 21, and a user can rotate the file 21 from the outside. When the file is rotated, the file 21 and the flint 22 rub against each other and thereby emit a spark. The spark generated from the flint comes into contact with gas+air and ignites, and a flame rises and heat the water container 30 from a bottom. Since the flint 22 is worn down by rubbing against the file 21, the flint 22 is pushed upward by a pushing-up mechanism 25 from below, and is set in such a way that the flint 22 and the file 21 are in contact with each other with an appropriate pressure. The pushing-up mechanism 25 is constituted of a weak spring or screw.

The heat insulating support 40 is formed of a cylindrical heat insulating body having a diameter on which the water container 30 can be mounted, and is mounted on the combustion device 20 and fixed to the combustion device. It is not necessary to fix the heat insulating support when the combustion device is in a non-wobbling place. The heat insulating support 40 is adjusted in height in such a way that the flame impinges on the bottom of the water container 30. As the heat insulating support 40, ceramic or the like having low thermal conductivity is preferably used. Small holes are formed in the sound insulating case 15 and the heat insulating support 40 in order that sufficient air is supplied.

Next, the water container 30 is described. Viewed from above, the water container 30 is circular, open at a top, and is in a shape of a round pot with a diameter decreasing towards the bottom. FIG. 2 is a cross-sectional diagram of the water container 30 cut in a depth direction of the container. The water container 30 includes a base unit 31, a magnetic metal plate 32, electrodes 33a and 33b, and wirings 37a and 37b. The base unit 31 is made of aluminum and in a shape of a round pot, and the magnetic metal plate 32 is bonded to a bottom plate of the base unit 31 and has spontaneous magnetization M in an in-plane direction, and in the present example embodiment, a magnetic alloy such as magnetic stainless steel is used as the magnetic metal plate 32. The electrodes 33a and 33b are each provided on an upper rim of the base unit 31 in order to extract, to an outside, electric power, which is generated by the magnetic metal plate 32 by heating. The wirings 37a and 37b connect the electrodes to an external circuit 18 to be described later. The wires 37a and 37b may be made of a suitably hard material in order not to be immersed in the water container 30 and not to interfere when the water container is inserted or removed, and may be positioned around an upper or outer side of an end of the water container 30.

Figure 3:
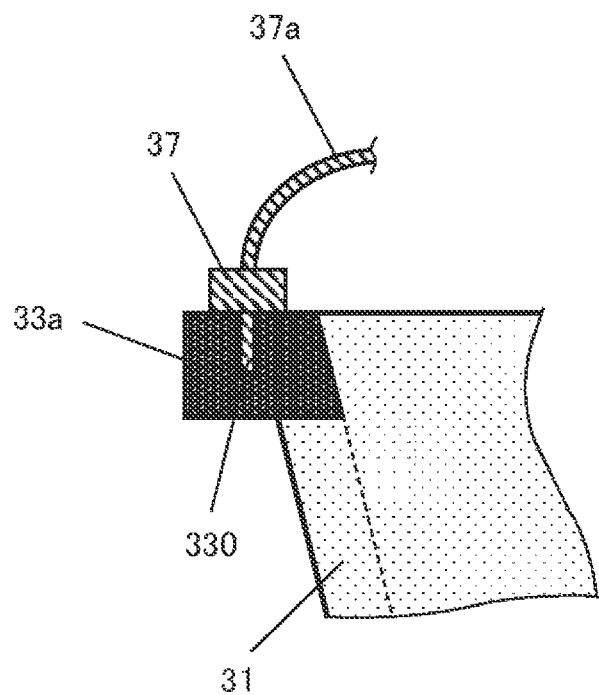
FIG. 3 is a cross-sectional diagram illustrating a connection between a wiring of the portable power supply and an electrode of the water container according to the first example embodiment.

As illustrated in cross section in FIG. 3, a female socket 330 is provided for each of the electrodes 33a and 33b, and each end of the wirings 37a and 37b is connected, as a male socket 37, to the female socket 330. Though not illustrated, two handles are attached to the upper portion of the base unit 31 for use in moving the base unit 31 in and out of the sound insulating case 15.

The sound insulating case 15 is a substantially cylindrical housing apparatus, and is divided into an upper sound insulating case 15a and a lower sound insulating case 15b in order that the container can be taken out when water is heated and boiled. The upper sound insulating case 15a is provided with an outlet 16 for the wirings 37a and 37b. Apart from the outlet 16, a water intake 17 is opened in the upper sound insulating case 15a, at a position that is above the water container 30. The water intake 17 is disposed at a center of the upper sound insulating case 15a when viewed from above. In order to check an amount of water contained in the water container, the upper sound insulating case 15*a* is made of transparent glass, or a transparent window is provided on a side surface of the upper sound insulating case or the lower sound insulating case.

The external circuit 18 for connecting the wirings 37*a* and 37*b* is provided near the outlet 16 of the upper sound insulating case 15*a*. The external circuit 18 is a DC-DC converter or the like. The external circuit 18 is connected to an output connector 19 for extracting, to an outside, a voltage generated in parallel with the heating of the water container 30 and the boiling of water.

When water, another liquid, ingredients to be cooked, mixtures thereof, and the like are put into the water container 30 and the bottom of the container is heated by fire of the combustion device 20, a thermal gradient VT is generated between a bottom side of the magnetic stainless steel and an inside of the container. The temperature gradient VT causes an anomalous Nernst effect in the magnetic stainless steel, whereby electromotive force is generated in an in-plane direction of the magnetic stainless steel, and the electromotive force is extracted from the electrodes at both ends, thereby enabling thermoelectric power generation. The anomalous Nernst effect is a phenomenon in which, when the thermal gradient VT is applied to a ferromagnetic material magnetized (M) in a certain direction, electromotive force E is generated in a direction (outer product direction) perpendicular to both M and VT. Since the magnetic stainless steel is a conductor, when a temperature difference is small, an output voltage cannot be very large. Therefore, when the voltage is boosted by a DC-DC converter in the external circuit 18, it is easy to use. When the voltage can be sufficiently acquired, the boosting is unnecessary.

In the portable power supply according to the present example embodiment, since only a part of the metal constituting the heating container needs to be a magnetic metal plate, a structure of the heating container can be extremely simple and low in cost, and the heating container and the combustion device are both provided and do not need to be separately installed.

All of the thermoelectric conversion elements in PTLs 1 to 4 are required to form an element structure and are costly. For example, in PTL 1, it is necessary to manufacture a thermoelectric conversion module in which a p-type thermoelectric conversion element and an n-type thermoelectric conversion element are joined by an electrode, which results in a cost that is exceptionally high as a cooking vessel. In addition, a Seebeck element as in PTLs 1 to 4 in which thermoelectric conversion elements are arranged in parallel has low thermal conductivity in an arranged direction. For this reason, an apparatus in which heating is apt to become uneven, such as a cooking vessel, is apt to break or deform due to local thermal expansion, and cooking performance thereof is poorer than a normal pan, as baking is performed ununiformly, it takes a long time, or the like. However, in the present example embodiment, since only a part of the metal constituting the cooking vessel needs to be a magnetic metal plate, the structure is extremely simple and the cost can be reduced. Further, thermal conductivity in a direction in which the thermoelectric conversion elements are arranged is not lowered as in PTLs 1 to 4, and heating can be performed uniformly.

The portable power supply according to the present example embodiment is capable of generating electric power while heating for boiling water, cooking, or the like, even when a power supply is not available in an outdoor field, or due to a power failure. In addition, since the water container and the combustion device can be accommodated in the sound insulating case, large sound is not produced at a time of power generation and downsizing is possible, and therefore the portable power supply is suitable for a military application and the like.

In order to effectively perform temperature difference power generation, water may be constantly stored in the water container. In a presence of water, the inside of the water container (upper portion of the magnetic metal bottom plate) becomes less than or equal to 100° C., and therefore, a large temperature difference can be generated between the inside of the water container and a lower portion of the water container (lower portion of the magnetic metal bottom plate, up to 500° C.) that is directly heated. Since water evaporates gradually, water may be added from the water intake at an appropriate time during power generation.

In the present example embodiment, a stainless steel material, which is an iron-based alloy, is used as the magnetic metal plate 32. Stainless steel is generally classified into five classes (austenitic, ferritic-austenitic, ferritic, martensitic, and precipitation-hardening) according to classification on a metallographic structure. Among them, the stainless steels other than the austenitic stainless steel are ferromagnetic, and can be used as the magnetic metal plate according to the present example embodiment.

Figure 2:
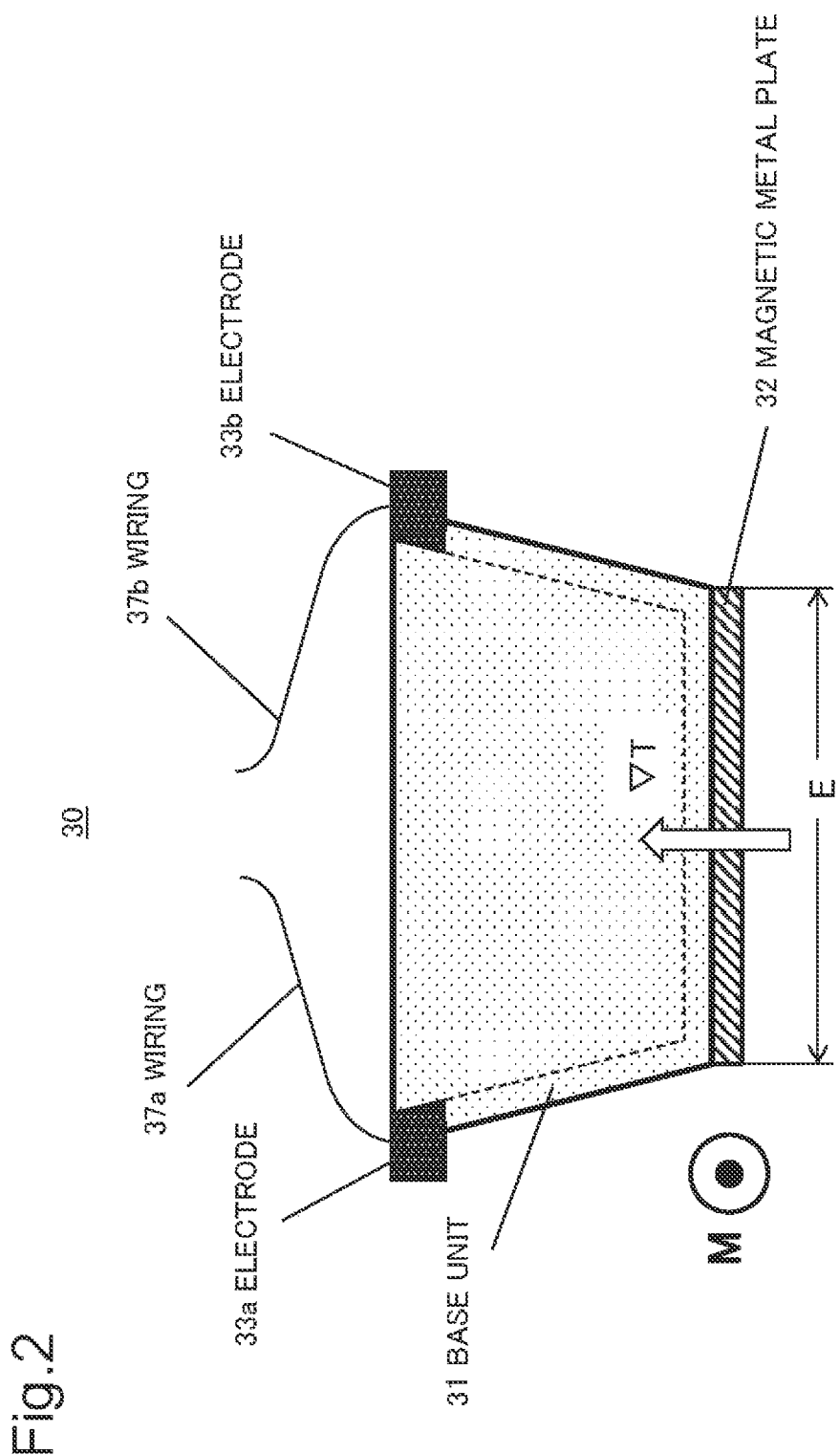
FIG. 2 is a cross-sectional diagram illustrating a water container used in the portable power supply according to the first example embodiment.

In the example in FIG. 2, the magnetic metal plate 32 is bonded to the bottom plate of the base unit 31 made of aluminum. The base unit 31 may be made of iron, a nonmagnetic alloy, copper, or the like, as well as aluminum. Further, the bottom portion itself of the base unit 31 may be the magnetic metal plate 32. Further, a side surface of the base unit 31 may also be made of a magnetic metal plate. In other words, a portion of the base unit 31 other than a portion that is directly heated may also be constituted of a magnetic metal plate, and the base unit 31 may be entirely constituted of the magnetic metal plate. The side surface may or may not generate electricity.

In the present example embodiment, a pan has been described as an example, but the present invention may also be applied to other cooking appliances such as a frying pan, a hot plate, a kettle, a cooker, and the like. The portable power supply according to the present example embodiment is round-shaped, but may also be rectangular-shaped.

Second Example Embodiment

Figure 4:
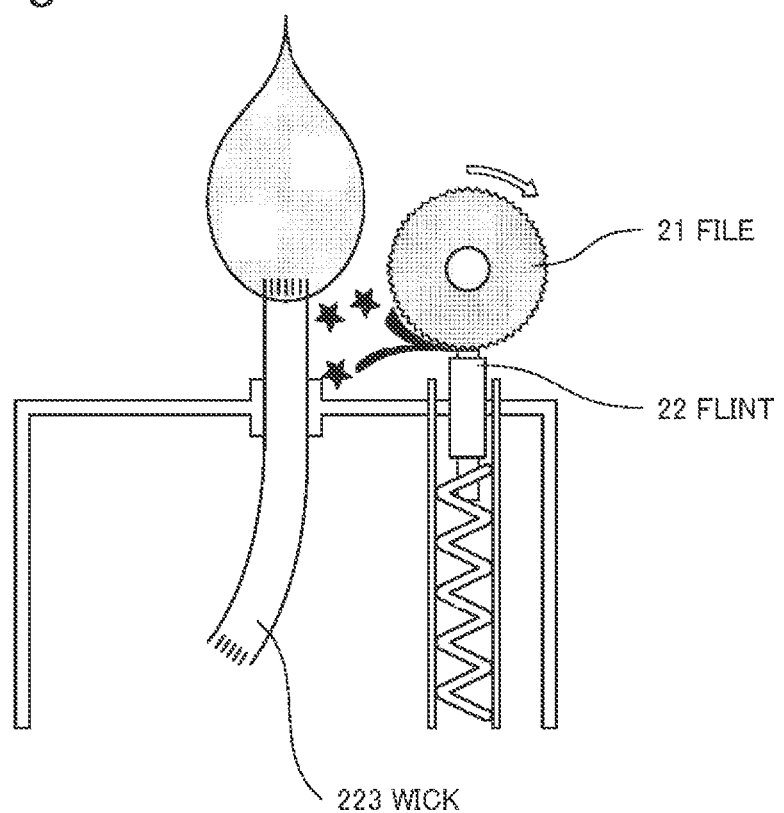
FIG. 4 is a diagram illustrating a combustion device used in a portable power supply according to a second example embodiment of the present invention.

FIG. 4 is a diagram illustrating a combustion device used in a portable power supply according to a second example embodiment of the present invention. A heat insulating support and a water container are omitted. In the first example embodiment, gas is used as a fuel, but in the present example embodiment, oil is used. When oil is used, a wick 223, which is a wick for volatilizing the oil, is immersed in the oil, instead of a nozzle. An aperture is made in a sound insulating case 15 at a position of a file 21, and a user can rotate the file 21 from an outside. When the file is rotated, the file 21 and a flint 22 rub against each other and thereby emit a spark. The spark generated from the flint comes into contact with oil gas volatilized from the wick 223+air and ignites, and a flame heats a water container 30 from a bottom.

Third Example Embodiment

Figure 5A:
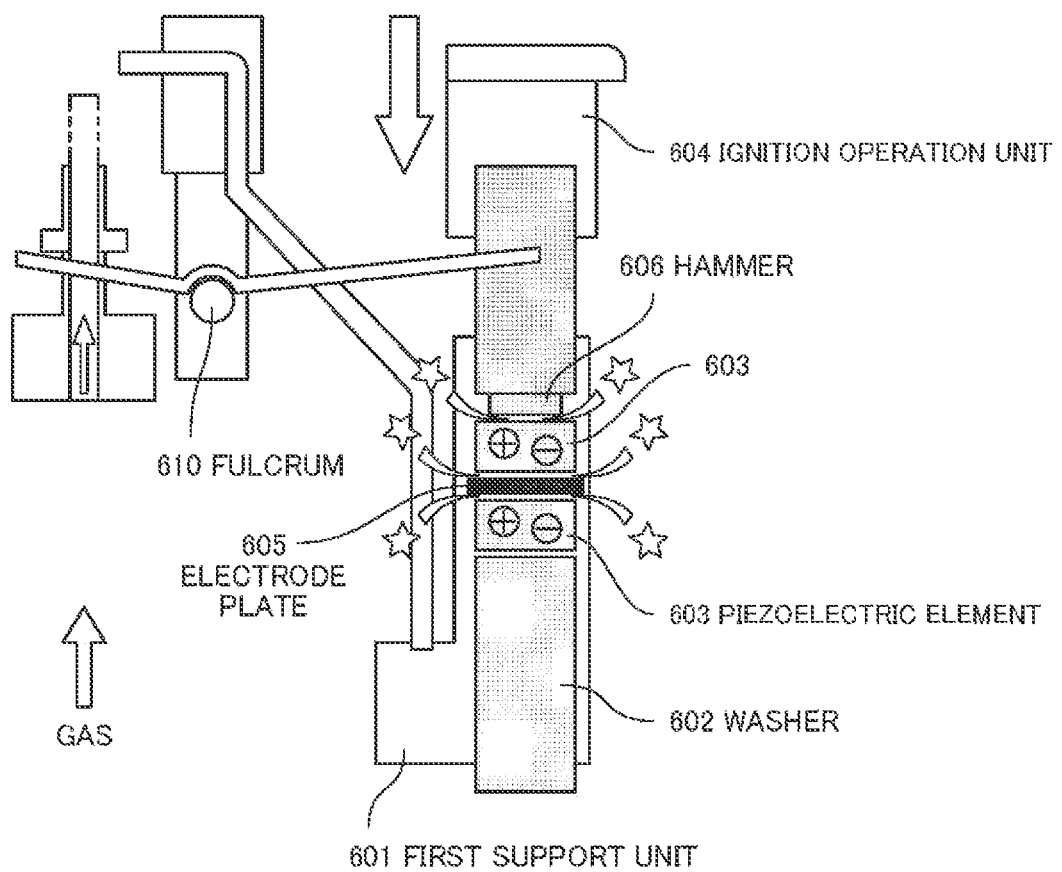
FIG. 5A is a diagram illustrating a combustion device used in a portable power supply according to a third example embodiment of the present invention.
Figure 5B:
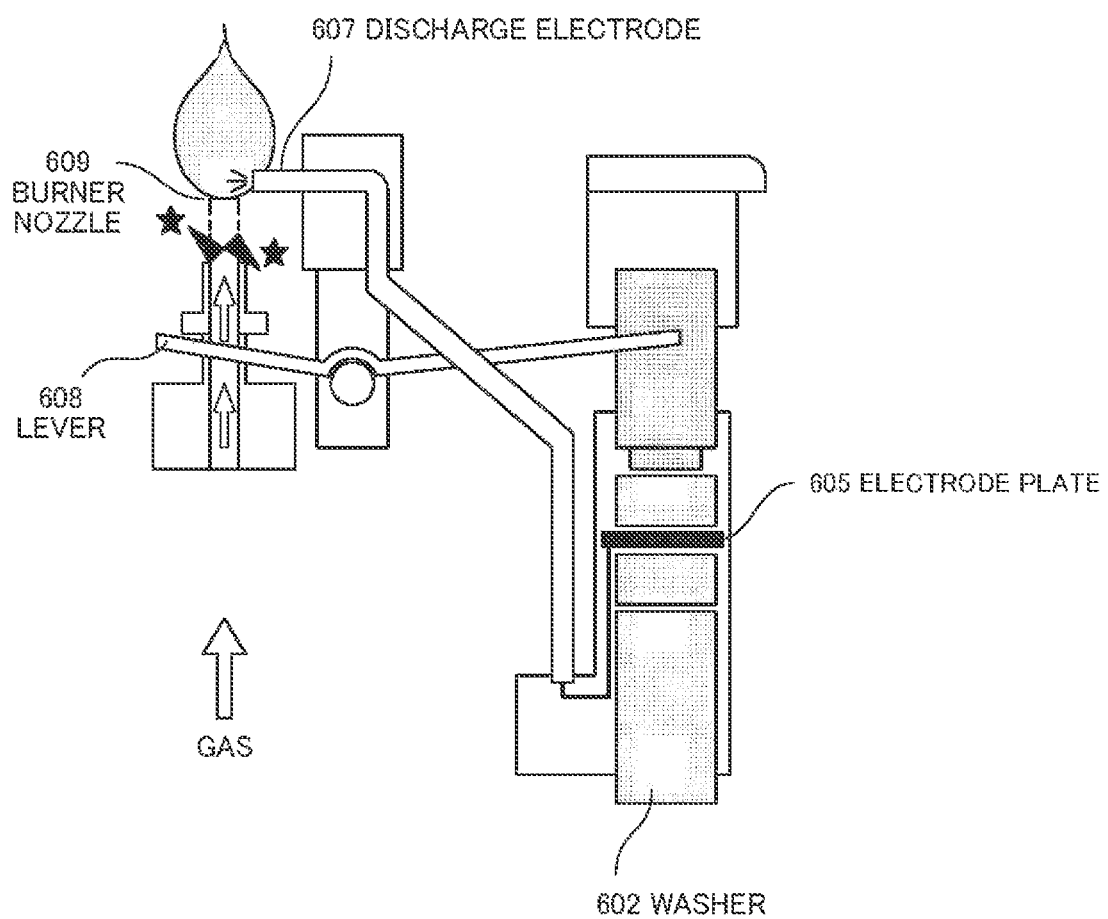
FIG. 5B is a diagram illustrating the combustion device used in the portable power supply according to the third example embodiment of the present invention.

An ignition method of the combustion device according to the first and second example embodiments is the same principle as that of a flint-type lighter, but may also be an electronic-type using a piezoelectric element. FIGS. 5A and 5B are diagrams illustrating an electronic-type ignition method according to the present example embodiment. A washer 602 is provided on a first support unit 601, a piezoelectric element 603 is provided on top of the washer 602, and an ignition operation unit 604 that moves vertically is disposed above the piezoelectric element 603. The piezoelectric element 603 is divided into two parts, and an electrode plate 605 is sandwiched therebetween. The ignition operation unit 604 is provided with a hammer 606 that strongly hits the piezoelectric element 603 by a user operation.

As illustrated in FIG. 5A, when a user presses down (downward arrow in FIG. 5A) the ignition operation unit 604 (lever), the hammer 606 hits the piezoelectric element 603, and the piezoelectric element 603 generates electric energy (voltage). The voltage is transmitted to the electrode plate 605. In order that a user can touch the ignition operation unit 604, a hole is made in a casing (not illustrated) and the ignition operation unit 604 is exposed to an outside through the hole.

The voltage transmitted to the electrode plate 605 is transmitted to a discharge electrode 607, and a voltage transmitted to the washer 602 is transmitted from a lever 608 to a burner nozzle 609. As a result, discharge occurs from the discharge electrode 607 in a direction toward the burner nozzle 609 that serves as ground. Gas emitted from the burner nozzle 609 mixes with surrounding air, comes into contact with a spark generated by the discharge, and ignites. The rest is the same as in the first and second example embodiments.

The hammer 606 is connected to the lever 608 via a fulcrum 610. Therefore, when a user presses down the ignition operation unit 604, the lever 608 moves upward, which is a direction opposite to movement of the hammer 606, and pushes up the burner nozzle 609. A processing nozzle and the discharge electrode are brought close to each other only when ignition occurs.

Fourth Example Embodiment

FIG. 6 is a cross-sectional diagram illustrating a cooking vessel used in a portable power supply according to a fourth example embodiment of the present invention. In the present example embodiment, an insulating layer 43 is formed on a bottom surface of a base unit 31. The insulating layer 43 is, for example, an aluminum oxide (alumina) film, and is formed by anodizing a nonmagnetic metal plate (aluminum) at a bottom of the base unit 31. A magnetic metal plate 32 made of magnetic stainless steel or the like is bonded to the insulating layer 43. In order to ensure conduction between the magnetic metal plate 32 and electrodes 33a and 33b, conductive units 38a and 38b that connect a side surface of the base unit 31 and the magnetic metal plate 32 are provided. The conductive units 38a and 38b may be made of the same material as the magnetic metal plate, or may be made of a different material such as aluminum or nonmagnetic SUS 304.

When the insulating layer 43 is provided between the bottom surface of the base unit 31 and the magnetic metal plate 32, electrical design is easy. Specifically, an electric current generated by acquired electromotive force flows almost only in the magnetic metal plate 32 and hardly flows to the base unit 31, and therefore, a loss of generated electric power is small. When a magnetic metal is also formed on the side surface of the base unit 31, the insulating layer 43 is formed between the magnetic metal and the base unit on the side surface as well.

Fifth Example Embodiment

Figure 7:
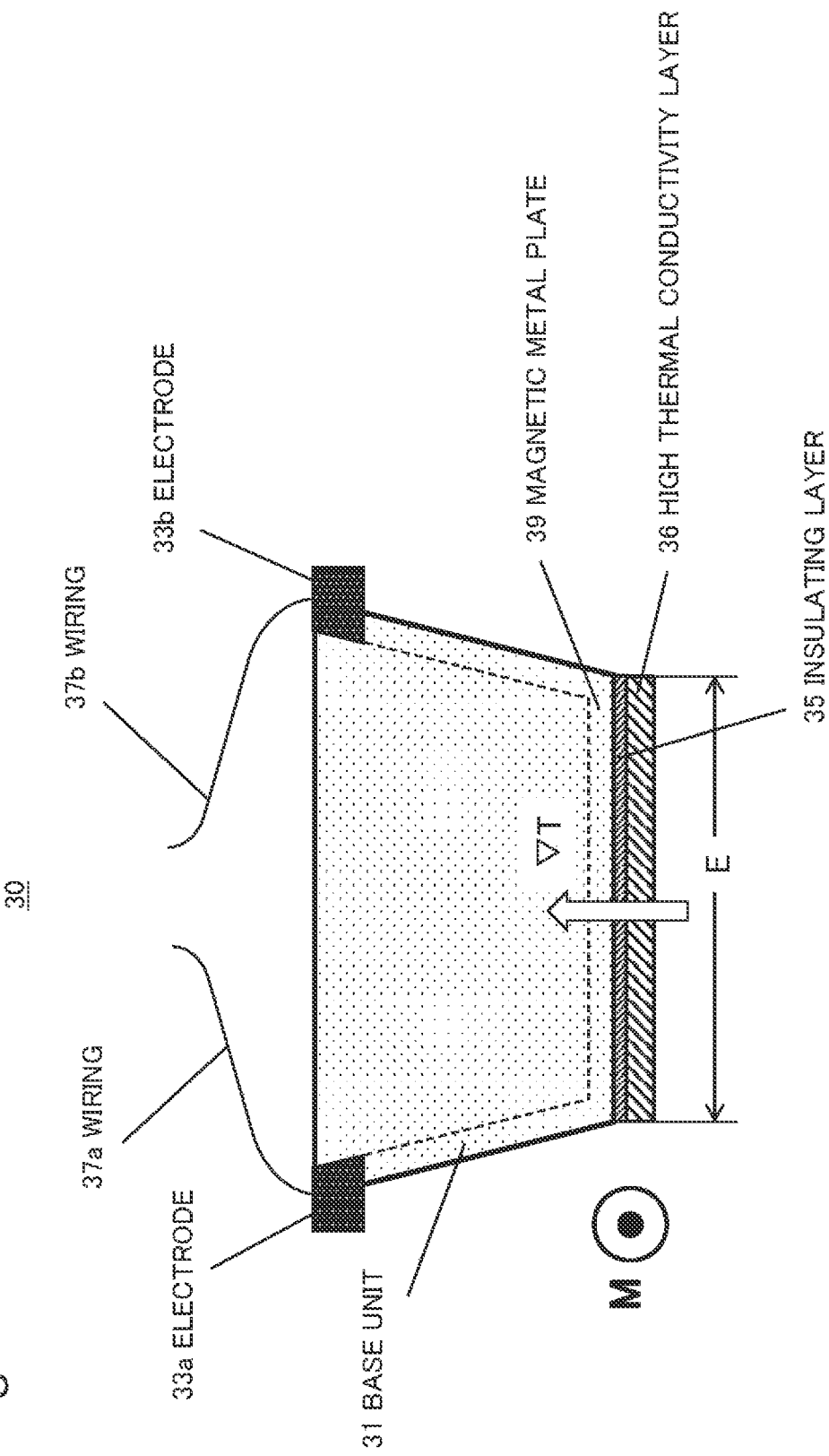
FIG. 7 is a cross-sectional diagram illustrating a cooking vessel used in a portable power supply according to a fifth example embodiment of the present invention.

FIG. 7 is a cross-sectional diagram illustrating a cooking vessel used in a portable power supply according to a fifth example embodiment of the present invention. In order to effectively perform thermoelectric conversion, it is desirable that a temperature on a high-temperature side (bottom) of a water container is uniform to some extent in a plane. A portion in direct contact with a fire becomes hotter than a portion in non-direct contact with the fire. Then, generation of electromotive force in a magnetic metal plate 32 becomes spatially uneven due to location dependence of the temperature difference generated between an upper portion and a lower portion of the magnetic metal plate 32, and current generated in a high temperature difference portion escapes to a low temperature difference portion, and thus the current cannot be extracted to an outside by escaped amount. Such a problem does not occur when the whole cooking vessel is made of a material having a high thermal conductivity, such as aluminum or an aluminum alloy. However, a magnetic metal has a low thermal conductivity compared to an aluminum alloy or the like.

Therefore, in the portable power supply according to the present example embodiment, as illustrated in FIG. 7, a high thermal conductivity layer made of an aluminum alloy or the like is provided as a lowermost layer of a base unit 31. Further, a bottom portion of the base unit 31 is a magnetic metal plate 39 made of magnetic stainless steel or the like. Provision of a high thermal conductivity layer 36 facilitates lateral thermal conduction of the bottom portion and increases temperature uniformity on a high temperature side. In terms of electrical design, it is desirable that a thin insulating layer 35 (a non-conductive layer) such as an oxide film is provided between the magnetic metal plate 39 and the high thermal conductivity layer 36.

Sixth Example Embodiment

Figure 8B:
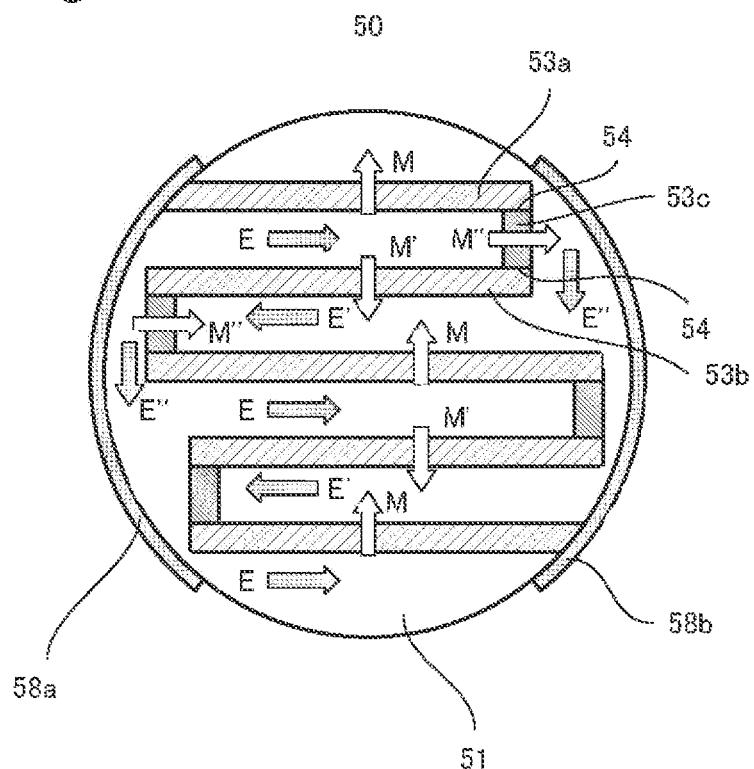
FIG. 8B is a diagram illustrating a back surface of the cooking vessel according to the fourth example embodiment of the present invention.
Figure 8C:
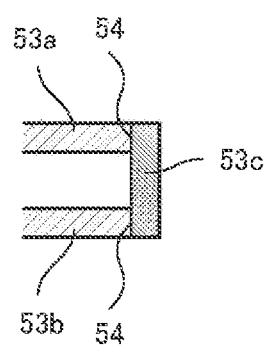
FIG. 8C is a diagram illustrating a back surface of the cooking vessel according to the fourth example embodiment of the present invention.

FIGS. 8A, 8B, and 8C illustrate a back side of a cooking vessel 50 according to a sixth example embodiment of the present invention. The magnetic metal plate according to the first to third example embodiments is one plate, but in the present example embodiment, a magnetic metal plate is patternized. In FIG. 8A, the magnetic metal plate is divided into five strips in an elongated shape and a space is provided therebetween. Both ends of a strip-shaped magnetic metal plate 52 form conductive plates 58a and 58b in a similar way to the third example embodiment. Spontaneous magnetization M of the divided magnetic metal plate 52 is all oriented in the same direction in a plane.

In order to make a temperature distribution in the plane uniform, a width of the strip may be appropriately narrowed. For example, the strips are narrow enough to divide the magnetic metal plate 32 according to the first to third embodiments into four or five portions in one direction.

In FIG. 8B, the magnetic metal plate 32 has a winding shape (meandering shape). Magnetization directions M and M' of the magnetic metal plates 53a and 53b are directions of line widths in a plane of the magnetic metal plates 53a and 53b. Further, the direction M being a direction of spontaneous magnetization of the magnetic metal plate 53a and the direction M' being a direction of spontaneous magnetization of the magnetic metal plate 53b are opposite to each other and thereby acquired electromotive force E and acquired electromotive force E' are added together. A conductor plate 53c connecting the magnetic metal plates 53a and 53b may be a nonmagnetic metal, or be a magnetic metal plate having any magnetization direction as long as a length of the magnetic metal plate is shortened.

In FIG. 8B, a direction M" of spontaneous magnetization of the plate 53c is in the same plane as M and M' and is perpendicular to M and M'. The magnetic metal plates 53a and 53b are separated from the plate 53c by a boundary line 54. The boundary line 54 is set in such a way that the 53c becomes short in FIG. 8B, but may separate the plates in such a way that the 53c becomes longer as in FIG. 8C. Although not illustrated, the separation may be made in such a way that the 53c is shorter at a boundary between the 53a and the 53c, and the 53b is longer at a boundary between the 53b and the 53c.

In the present example embodiment, the magnetic metal plates 53a and 53b that are magnetized in advance are bonded to a bottom surface of a base unit 51. When a magnetic metal plate is formed in a serpentine shape as described above, the length can be increased as compared with a case where an entire planar surface is formed of a magnetic metal plate, and acquired electromotive force can be increased.

Further, only the magnetic metal plate 53a may be magnetized, and the magnetic metal plate 53b may be nonmagnetic instead of magnetic.

As a result, heat conduction from a high temperature side to a low temperature side is facilitated in a bottom plane of the base unit 51, and temperature uniformity is enhanced.

Note that, also in this example embodiment, similarly to the third example embodiment, it is possible to provide a high thermal conductivity layer and thereby make temperature of the high temperature side (bottom) of the cooking vessel uniform in the plane.

Seventh Example Embodiment

Figure 9:
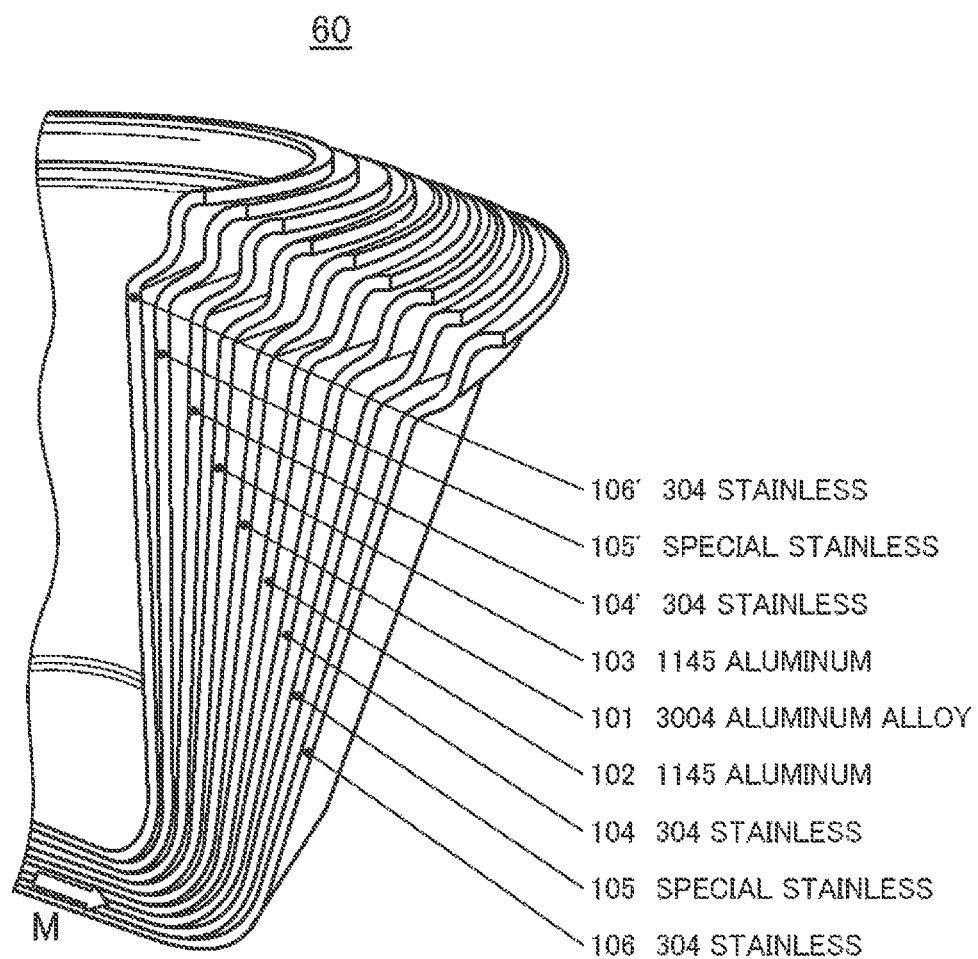
FIG. 9 is a cross-sectional diagram illustrating the cooking vessel used in the portable power supply according to the fifth example embodiment of the present invention.

FIG. 9 is a cross-sectional diagram illustrating a cooking vessel 60 used in a portable power supply according to a seventh example embodiment of the present invention. A magnetic metal plate according to the present example embodiment is formed by laminating thin magnetic alloy plates. The cooking vessel 60 includes a laminated structure of a 1145 aluminum 102, a 3004 aluminum 101, and a 1145 aluminum 103 in a middle of a plate thickness direction. Outside the laminated structure, there is a laminated structure of a 304 stainless steel 104, a special stainless steel 105 (for example, stainless steel to which several percent of silicon is added), and a 304 stainless steel 106. Likewise, inside the aluminum laminated structure, there is a laminated structure of a 304 stainless steel 104', a special stainless steel 105', and a 304 stainless steel 106'. The aluminum laminated structure is sandwiched between the outer and inner stainless steel laminated structures and rolled, and thereby the entire structure is processed into a single plate. A bottom surface of the outer stainless steel laminated structure has spontaneous magnetization M in an in-plane direction. A bottom surface of the inner stainless steel laminated structure may also have spontaneous magnetization M in an in-plane direction.

In an interface formed by laminating a thin magnetic alloy, thermoelectric conversion due to an anomalous Nernst effect is apt to occur, and large electromotive force can be acquired. Further, in a laminate structure, spontaneous magnetization can be stably maintained by shape magnetic anisotropy. A ferromagnetic material has a direction (magnetization-easy direction) in which, due to the shape, crystal structure, and atomic arrangement, the material is susceptible to magnetization, and this property is called magnetic anisotropy. A magnetic metal plate is easily magnetized in an in-plane direction of the plate, but when a thin plate is laminated, the magnetic metal plate is more easily magnetized in the in-plane direction, and the magnetization in the in-plane direction can be stably maintained.

Eighth Example Embodiment

Figure 10:
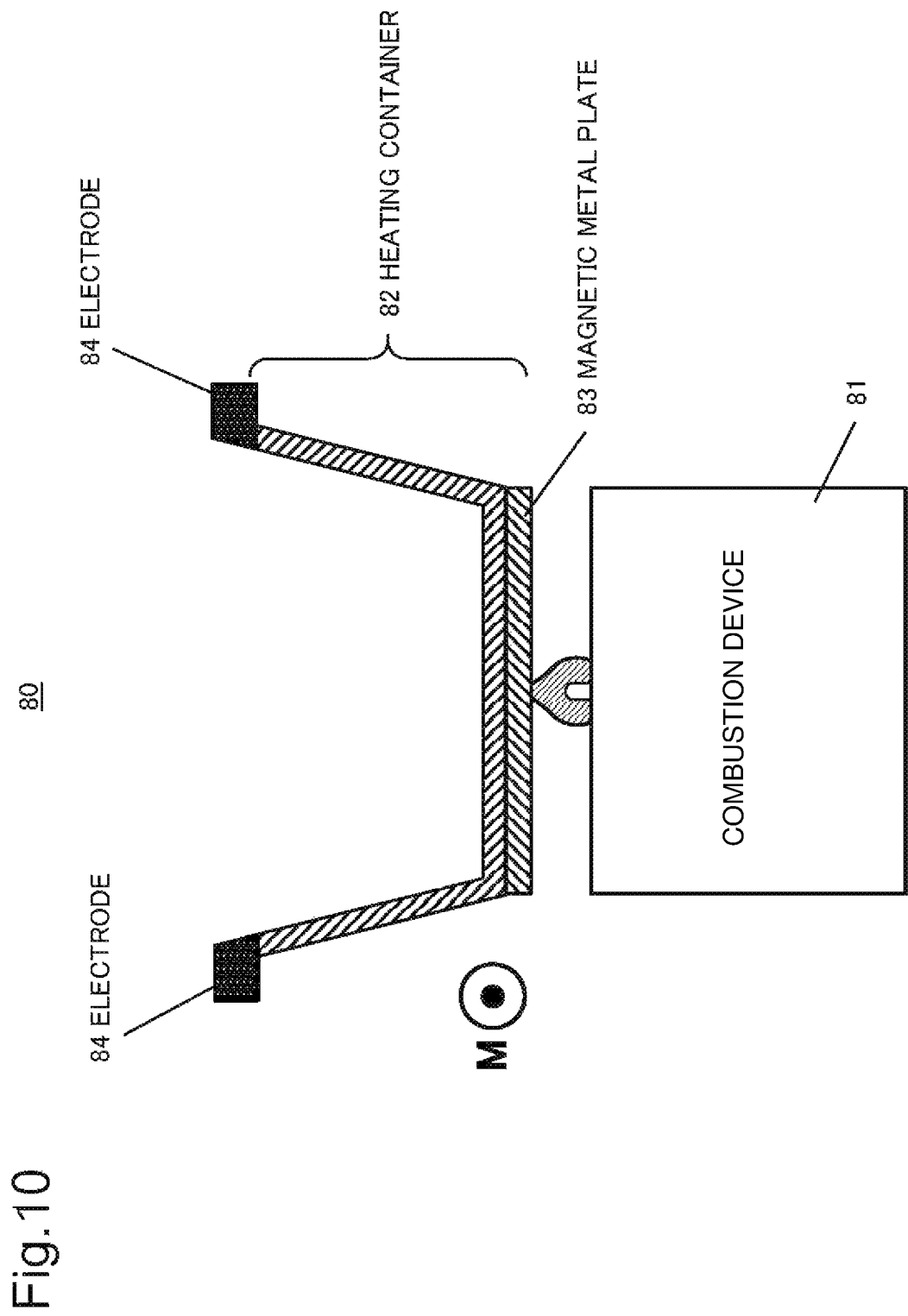
FIG. 10 is a schematic cross-sectional diagram illustrating a portable power supply according to a sixth example embodiment of the present invention.

FIG. 10 is a schematic cross-sectional diagram illustrating a portable power supply according to an eighth example embodiment of the present invention. A portable power supply 80 according to the present example embodiment includes a combustion device 81 and a heating container 82 holding a heating target and having a power generation function. The heating container 82 is provided with a magnetic metal plate 83 in at least a part of a portion that is directly heated by the combustion device 81. The magnetic metal plate 83 has spontaneous magnetization M, and an anomalous Nernst effect is produced by heating and electromotive force is generated. The magnetic metal plate 83 is provided with an electrode 84 for extracting the generated electric power.

In the portable power supply according to the present example embodiment, a structure of the heating container can be extremely simple and low in cost, and both the heating container and the combustion device are provided and are not necessary to be separately installed.

Other Example Embodiments

In the example embodiments described above, the combustion device has been described as a flint type or an electronic type, but an internal combustion type or an induction heating (IH) heater may be used.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese Patent Application No. 2018-227024, filed on Dec. 4, 2018, the disclosure of which is incorporated herein in its entirety by reference.

Some or all of the above-described example embodiments may also be described as the following supplementary notes, but are not limited to the following.

Supplementary Note 1

A portable power supply, including: a combustion device; and a heating container that holds a heating target, wherein the heating container includes, in at least a part of a portion that is directly heated by the combustion device, a magnetic metal plate having spontaneous magnetization and generating electromotive force by producing an anomalous Nernst effect by being heated, and an electrode for extracting electric power.

Supplementary Note 2

The portable power supply according to Supplementary note 1, wherein a heat insulating support is provided on the combustion device, and the heating container is provided on the heat insulating support.

Supplementary Note 3

The portable power supply according to Supplementary note 1 or 2, wherein the combustion device and the heating container are housed in a sound insulating case.

Supplementary Note 4

The portable power supply according to any one of Supplementary notes 1 to 3, wherein the combustion device includes a fuel tank, a nozzle for discharging fuel from the fuel tank, and an ignition unit in a vicinity of the nozzle.

Supplementary Note 5

The portable power supply according to any one of Supplementary notes 1 to 4, wherein the magnetic metal plate has spontaneous magnetization in an in-plane direction.

Supplementary Note 6

The portable power supply according to any one of Supplementary notes 1 to 5, wherein, in the directly heated portion, the magnetic metal plate is formed on a nonmagnetic metal plate via an insulating layer.

Supplementary Note 7

The portable power supply according to any one of Supplementary notes 1 to 6, wherein a metal plate having a higher thermal conductivity than the magnetic metal plate is provided on the magnetic metal plate.

Supplementary Note 8

The portable power supply according to any one of Supplementary notes 1 to 7, wherein the magnetic metal plate has a strip shape or a meandering shape.

Supplementary Note 9

The portable power supply according to any one of Supplementary notes 1 to 8, wherein the magnetic metal plate is formed by laminating thin magnetic metal plates.

Supplementary Note 10

The portable power supply according to any one of Supplementary notes 1 to 9, wherein the magnetic metal plate is a magnetic alloy.

Supplementary Note 11

The portable power supply according to any one of Supplementary notes 1 to 10, wherein the magnetic metal plate is also provided in a portion of the heating container that is not directly heated by the combustion device.

Supplementary Note 12

The portable power supply according to any one of Supplementary notes 1 to 11, wherein the magnetic metal plate is a magnetic stainless steel plate.

REFERENCE SIGNS LIST

10,80 Portable power supply
15 Sound insulating case
16 Outlet
17 Water intake
18 External circuit
19 Output connector
20, 81 Combustion device
21 File
22 Flint
23 Gas nozzle
24 Gas tank
25 Pushing-up mechanism
30 Water container
31,51 Base unit
32, 39, 52, 53a, 53b Magnetic metal plate
32a, 32b Electrode
37a, 37b Wiring
38a, 38b Conductive unit
40 Heat insulating support
35,43 Insulating layer
50,60 Cooking vessel
53c Plate
82 Heating container
601 First support unit
602 Washer
603 Piezoelectric element
604 Ignition operation unit
605 Electrode plate
606 Hammer
607 Discharge electrode
608 Lever
609 Burner nozzle
610 Fulcrum
102, 103 1145 aluminum
101 3004 aluminum
104, 104', 106, 106' 304 stainless steel
105, 105' Special stainless steel

What is claimed is:

1. A portable power supply, comprising: a combustion device; and a heating container that holds a heating target, wherein the heating container includes, in at least a part of a portion being directly heated by the combustion device, a magnetic metal plate having spontaneous magnetization and generating electromotive force by producing an anomalous Nernst effect by being heated, and an electrode for extracting electric power, wherein
the magnetic metal plate has a strip shape or meandering shape and comprises a plurality of magnetic plates, each of the plurality of magnetic plates having a linear or rectangular cross section and a spontaneous magnetization direction in a direction of a width of each of the plurality of magnetic plates, wherein the spontaneous magnetization directions of adjacent ones of the plurality of magnetic plates are opposite to one another.

2. The portable power supply according to claim 1, wherein a heat insulating support is provided on the combustion device and the heating container is provided on the heat insulating support.

3. The portable power supply according to claim 1, wherein the combustion device and the heating container are housed in a sound insulating case.

4. The portable power supply according to claim 1, wherein the combustion device includes a fuel tank, a nozzle for discharging fuel from the fuel tank, and an ignition unit in a vicinity of the nozzle.

5. The portable power supply according to claim 1, wherein the magnetic metal plate has spontaneous magnetization in an in-plane direction.

6. The portable power supply according to claim 1, wherein, in the directly heated portion, the magnetic metal plate is formed on a nonmagnetic metal plate via an insulating layer.

7. The portable power supply according to claim 1, wherein a metal plate having higher thermal conductivity than the magnetic metal plate is provided on the magnetic metal plate.

8. The portable power supply according to claim 1, wherein the magnetic metal plate is formed by laminating thin magnetic metal plates.

9. The portable power supply according to claim 1, wherein the magnetic metal plate is a magnetic alloy.

10. The portable power supply according to claim 1, wherein the magnetic metal plate is also provided in a portion of the heating container that is not directly heated by the combustion device.

11. The portable power supply according to claim 1, wherein the magnetic metal plate is a magnetic stainless steel plate.

12. A portable power supply, comprising: a combustion device; and a heating container that holds a heating target, wherein the heating container includes, in at least a part of a portion being directly heated by the combustion device, a magnetic metal plate having spontaneous magnetization and generating electromotive force by producing an anomalous Nernst effect by being heated, and an electrode for extracting electric power, wherein the magnetic metal plate is provided at a bottom of the heating container, and a metal plate is provided on the magnetic metal plate, which has higher thermal conductivity than the magnetic metal plate and covers all of the magnetic metal plate, and an insulating layer is provided between the metal plate and the magnetic metal plate.

13. The portable power supply according to claim 12, wherein the magnetic metal plate has a strip shape or meandering shape and comprises a plurality of magnetic plates, each of the plurality of magnetic plates having a linear or rectangular cross section and a spontaneous magnetization direction in a direction of a width of each of the plurality of magnetic plates, wherein the spontaneous magnetization directions of adjacent ones of the plurality of magnetic plates are opposite to one another.

* * * * *